(12) United States Patent
Lewis

(10) Patent No.: US 7,215,141 B2
(45) Date of Patent: May 8, 2007

(54) MERGED LOGIC ELEMENT ROUTING MULTIPLEXER

(75) Inventor: David Lewis, Toronto (CA)

(73) Assignee: Altera Corporation, San Jose, CA (US)

(*) Notice: Subject to any disclaimer, the term of this patent is extended or adjusted under 35 U.S.C. 154(b) by 197 days.

(21) Appl. No.: 11/021,842

(22) Filed: Dec. 22, 2004

(65) Prior Publication Data

US 2006/0132176 A1    Jun. 22, 2006

(51) Int. Cl.
*H03K 19/177* (2006.01)
(52) U.S. Cl. ................................. 326/41; 326/47
(58) Field of Classification Search ............ 326/37–41, 326/47
See application file for complete search history.

(56) References Cited

U.S. PATENT DOCUMENTS

| 5,883,525 A * | 3/1999 | Tavana et al. ................ 326/39 |
| 6,335,634 B1 * | 1/2002 | Reddy et al. .................. 326/41 |
| 6,621,298 B2 * | 9/2003 | Agrawal et al. ............... 326/50 |
| 6,630,842 B1 | 10/2003 | Lewis et al. |
| 6,826,741 B1 | 11/2004 | Johnson et al. |

\* cited by examiner

*Primary Examiner*—James H. Cho
(74) *Attorney, Agent, or Firm*—Beyer Weaver LLP

(57) ABSTRACT

A merged logic element routing multiplexer circuit includes one or more inputs coupled to the logic element (LE) output, one or more tri-stated circuits coupled to the corresponding one or more inputs, wherein the tri-stated circuits are controlled by a set of programmable select signals, and an output port coupled to the inter logic array block (LAB) routing wire, where the output port is connected to outputs of the tri-stated circuits through a buffer circuit.

27 Claims, 9 Drawing Sheets

MERGED LOGIC ELEMENT ROUTING MULTIPLEXER

FIELD OF THE INVENTION

The present invention relates to the field of programmable logic devices. In particular, the present invention relates to a merged logic element routing multiplexer.

BACKGROUND OF THE INVENTION

Existing programmable logic devices (PLDs) use routing multiplexers to implement programmable routing structures, such as the Stratix II family of PLDs produced by Altera Corporation. FIG. 1 illustrates a simplified representation of the architecture of a logic array block (LAB). An LAB 100 contains a number of logic elements (LEs) 102 that can perform a set of logic functions, such as a lookup table (LUT). Each LE 102 may also contain other structures such as a flip-flop (FF) or an adder. To connect the output of an LE to the input of other LEs, various routing structures are used. The routing structures are multiplexers that can be configured to select an output signal from a set of input signals, and to send the output along a routing wire. The first stage is the LE output multiplexer (LEOM) 104, which can select from one or more of the signals from the LUT, FF, or adder. The LEOM 104 drives an output stub 106 that can connect to the input of various driver input multiplexers (DIMs) 108. Each DIM 108 drives a routing wire of a predetermined length. A typical segment of a routing wire may span 4 LABs in the horizontal direction (either left-going or right-going) and is denoted as an H4 wire 110. The DIM is conventionally given the name corresponding to the type of wire it drives, so that a DIM driving an H4 wire is referred to as an H4 DIM. A wire in the vertical direction, either up-going or down-going, is referred to as a V4 wire 112. At the input side, a set of LAB input multiplexers (LIMs) 114 receive input signals from either horizontal or vertical wires. The LIMs 114 select signals between a set of routing wires and drive the selected signals onto a set of LAB lines 116, which are internal to the LAB 100. The set of LAB lines 116 are in turn received by an LE input multiplexer (LEIM) 118, which drives the input of the LE 102.

Along the length of each routing wire, connections to the inputs of other DIMs are provided, so that each DIM may select as its input another routing wire. For example, an H4 wire may connect to the input of other V4 DIMs to allow a routing connection to proceed horizontally and then vertically. At the end of each routing wire, at least one input to another DIM of the same type is provided, so that routing wires can be connected in series. This method of connecting routing wires serially is called stitching. FIG. 2 illustrates a method of stitching segments of routing wires. As shown in FIG. 2, a first set of four LABs (only one LAB 100a is shown) and a second set of four LABs (100b, 100c, 100d, and 100e) are arranged in a row. The routing wires between the two sets of LABs are stitched together by using a first H4 DIM 108a at LAB 100a. Similarly, a second H4 DIM 108b connects the H4 wire 110 to the next set of four LABs at LAB 100e.

Both DIMs and LIMs are arranged in columns on both sides of the LEs in the LAB, and an LE may drive DIM inputs not only in its own LAB, but also in adjacent LABs. Architecture of a routing structure for a PLD is described in U.S. Pat. No. 6,630,842, which is incorporated herein by reference in its entirety.

An array of LABs may be placed in a PLD in a grid of X-Y locations. The various routing wires in a given row and column of LABs form the horizontal and vertical channels. The starting points of consecutive wires within a channel are usually staggered, or offset by one LAB.

FIG. 3 illustrates a prior art implementation of a DIM in a programmable logic device. The DIM includes both multiplexing stages and driver stages of a routing structure. In particular, a regular DIM path includes a set of regular input multiplexers 302, a level-restorer circuit 306, and a buffer circuit 308. A regular input multiplexer 302 is typically implemented as two levels of negative metal-oxide semiconductor (NMOS) pass transistors followed by a level-restorer and a buffer. A fast DIM path includes a set of fast input multiplexers 304, the level-restorer circuit 306, and the buffer circuit 308. A fast input multiplexer 304 typically uses a single pass transistor. This fast input multiplexer 304 is connected to an LE output to provide a fast routing connection for the first stage of the routing. A limited number of fast input multiplexers, typically one per DIM, are provided because they are more expensive and because a large number of fast input multiplexers may increase the load on the input of the level-restorer circuit 306, which in turn may lower the performance of the PLD.

As shown in FIG. 1, the shortest signal path between two LEs in two different LABs contains at least four separate logic blocks: LEOM 104, DIM 108, LIM 114, and LEIM 118. A signal travels through these four logic blocks upon leaving an LE. This is the critical path for signal transmission between the output of one LE and the input of another LE via an inter-LAB routing wire. Therefore, there is a need to improve the performance of signal transmission of the PLD. Because global routing wires are required for general paths, one such way of doing so is to reduce the delay of transmitting a signal from the LE to the routing wire.

SUMMARY

A merged LE routing multiplexer (MLRM) circuit is disclosed. The MLRM improves the performance of a PLD by substantially reducing or eliminating the delay of the first DIM and thus removing the delay associated with the first DIM and the first routing wire segment in each routing path. In one embodiment, an MLRM circuit includes one or more inputs coupled to the LE output, one or more tri-stated circuits coupled to the corresponding one or more inputs, where the tri-stated circuits are controlled by a set of programmable select signals, and an output port coupled to the inter-LAB routing wire, wherein the output port is connected to the outputs of the tri-stated circuits through a buffer circuit.

In another embodiment, a programmable logic device includes a first LE of a sender LAB, an inter-LAB routing wire connected to one or more receivers, and an MLRM that receives outputs from the first LE of the sender LAB and drives the inter-LAB routing wire connected to the one or more receivers. The one or more receivers may include other LABs, DIMs, or LIMs.

In yet another embodiment, a programmable logic device includes a first LE of a sender LAB, an inter-LAB routing wire connected to one or more receivers, and an MLRM that receives outputs from the first LE of the sender LAB and drives the inter-LAB routing wire connected to the one or more receivers. The inter-LAB routing wire is a star wire for routing signals to the plurality of LABs on four directions of the MLRM both horizontally and vertically.

BRIEF DESCRIPTION OF THE DRAWINGS

The aforementioned features and advantages of the invention as well as additional features and advantages thereof will be more clearly understandable after reading detailed descriptions of embodiments of the invention in conjunction with the following drawings.

Like numbers are used throughout the figures.

DESCRIPTION OF EMBODIMENTS

The following descriptions are presented to enable any person skilled in the art to make and use the invention. Descriptions of specific embodiments and applications are provided only as examples. Various modifications and combinations of the examples described herein will be readily apparent to those skilled in the art, and the general principles defined herein may be applied to other examples and applications without departing from the spirit and scope of the invention. Thus, the present invention is not intended to be limited to the examples described and shown, but is to be accorded the widest scope consistent with the principles and features disclosed herein.

Figure 4:
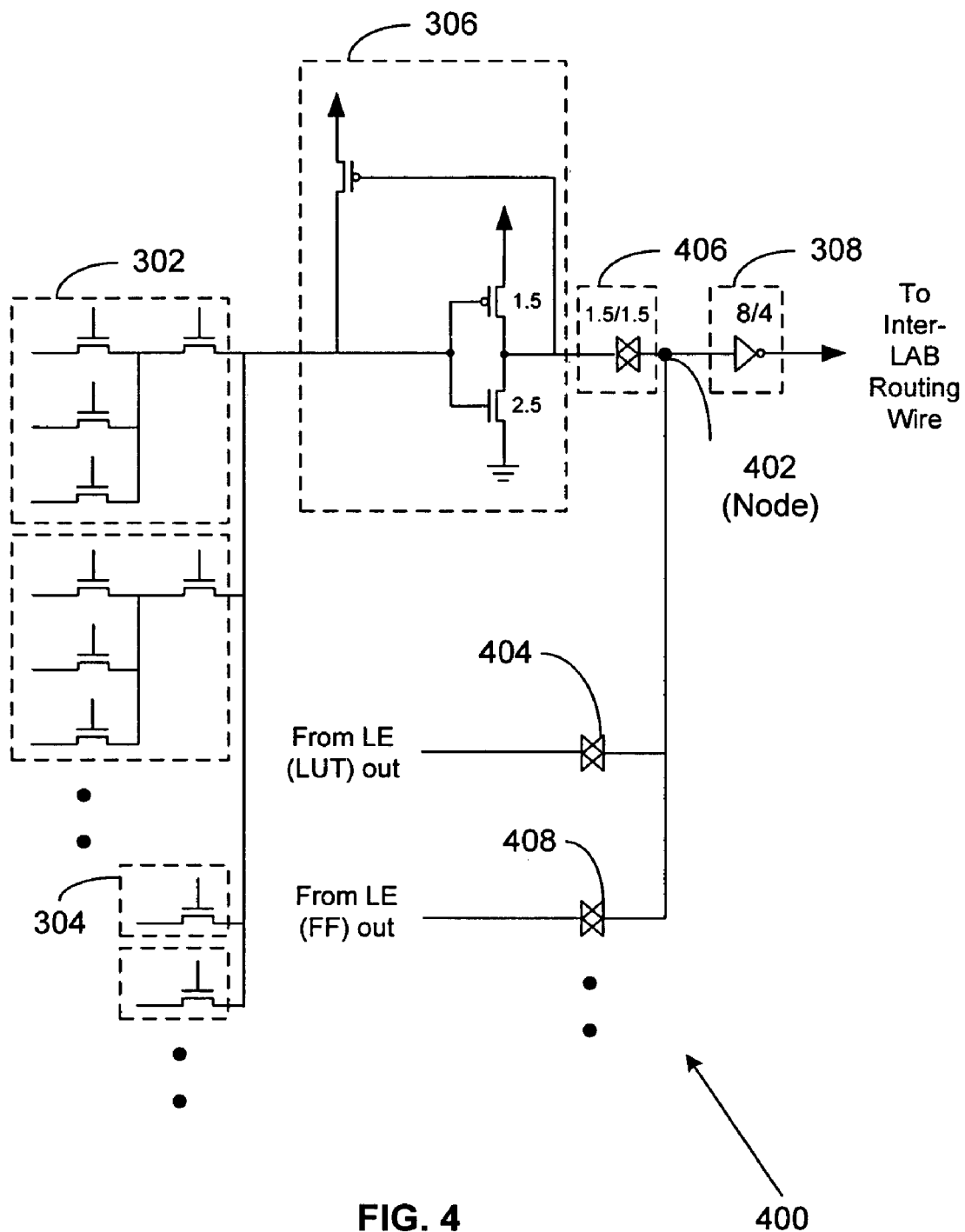
FIG. 4 illustrates an implementation of a merged LE routing multiplexer (MLRM) according to an embodiment of-the present invention.

FIG. 4 illustrates an implementation of a merged LE routing multiplexer (MLRM) according to an embodiment of the present invention. The MLRM 400 combines the functionalities of the LEOM 104 and DIM 108 and allows one or more inputs associated with the outputs of an LE to be merged into the MLRM 400. As shown in FIG. 4, the MLRM includes one or more regular input multiplexers 302, one or more fast input multiplexers 304, a level restorer circuit 306, a buffer circuit 308, a CMOS pass gate transistor 406, and one or more tri-stated circuits 404 and 408. One or more outputs of the LE are merged into the DIM, driving node 402 of the DIM through tri-stated circuits 404 and 408. A tri-stated circuit may be implemented by a complementary metal-oxide semiconductor (CMOS) pass gate transistor. These outputs of the LE are referred to as MLRM driver inputs. The tri-stated circuits are controlled by a set of programmable select signals, which select a particular tri-stated circuit to drive the node 402. The path from the LE to a routing wire includes one CMOS pass gate transistor and a buffer 308, eliminating a delay approximately equivalent to that of a DIM 108. Thus each LE output can essentially directly drive one segment of routing wire (of 4 LABs long). The other outputs of the LE still drive the DIM through the regular input multiplexer 302 and fast input multiplexer 304. The LUT output may directly drive the DIM buffer without additional buffering because the output buffer 308 associated with the DIM 108 is typically comparable in size to the LE output driver. Note that if the LE output driver is substantially smaller than the DIM driver (buffer 308), additional stages of buffering may be employed to compensate the LE output driver to retain the advantages of the invention. In other embodiments, more than one output of the LE is merged into the DIM, such as an output from the FF. The FF output drives the node 402 through a CMOS pass gate transistor 408.

Figure 5:
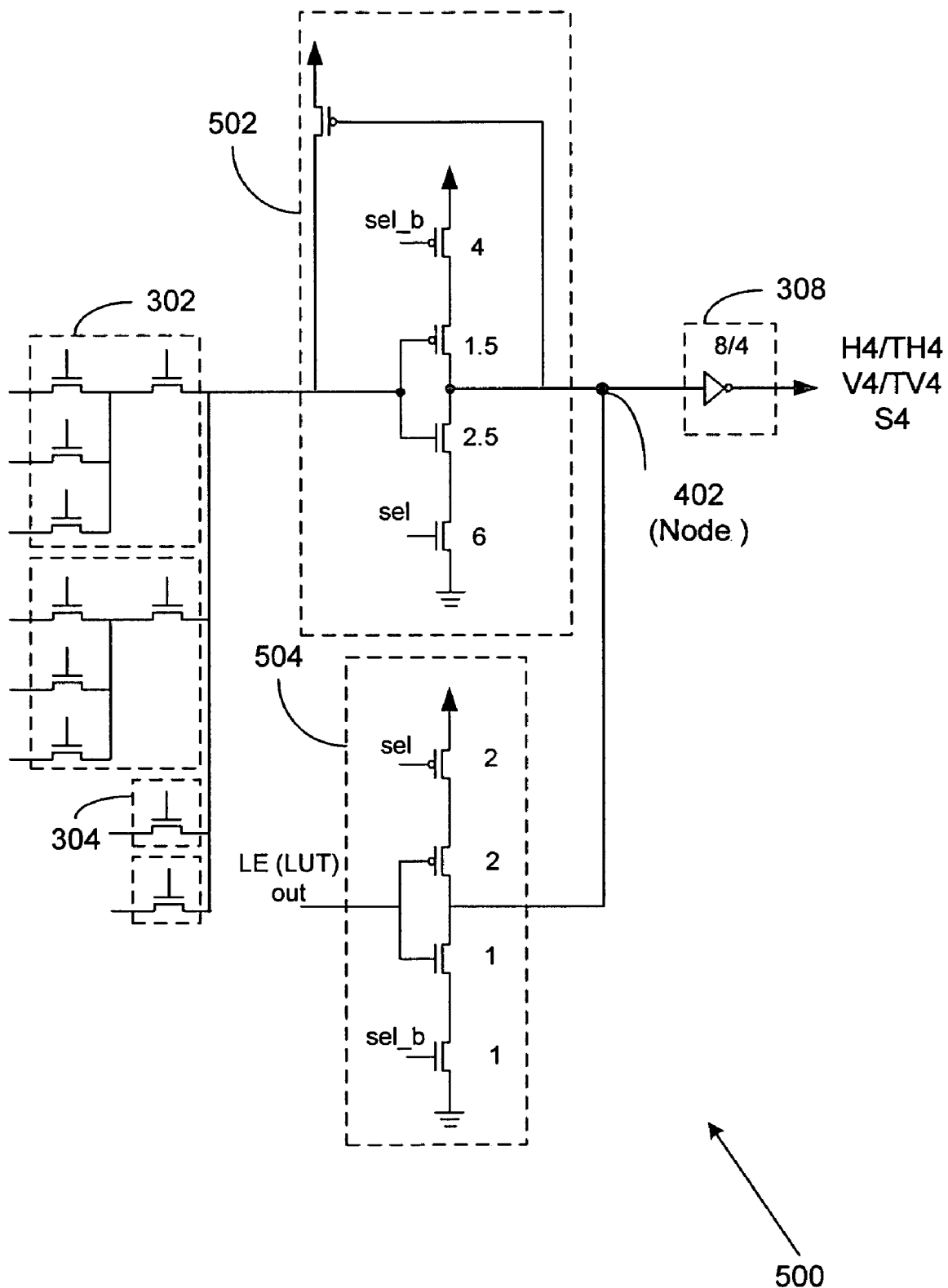
FIG. 5 illustrates another implementation of an MLRM according to an embodiment of the present invention.

In FIG. 4, the delay of the DIM may be increased because of the delay introduced by the additional CMOS pass gate transistor 406 inserted in the signal path. This delay can be reduced by using a tri-stated level restoring circuit 502 as shown in FIG. 5. The tri-stated level restoring circuit 502 replaces the level-restorer circuit 306 and the CMOS pass gate circuit 406 with a tri-stated circuit, using larger gating transistors placed between the tri-stated circuit, the power supply, and the circuit ground. Due to the use of larger gating transistors, the tri-stated level restoring circuit 502 causes minimal extra delay compared to the level-restorer circuit 306. A tri-stated circuit 504 is used to receive the input signal from LUT out and drive the node 402. Thus, the delay of the CMOS pass gate transistor 406 of FIG. 4 is substantially reduced. Note that both the tri-stated level restoring circuit 502 and the tri-stated circuit 504 may be controlled by a set of programmable select signals.

Figure 6:
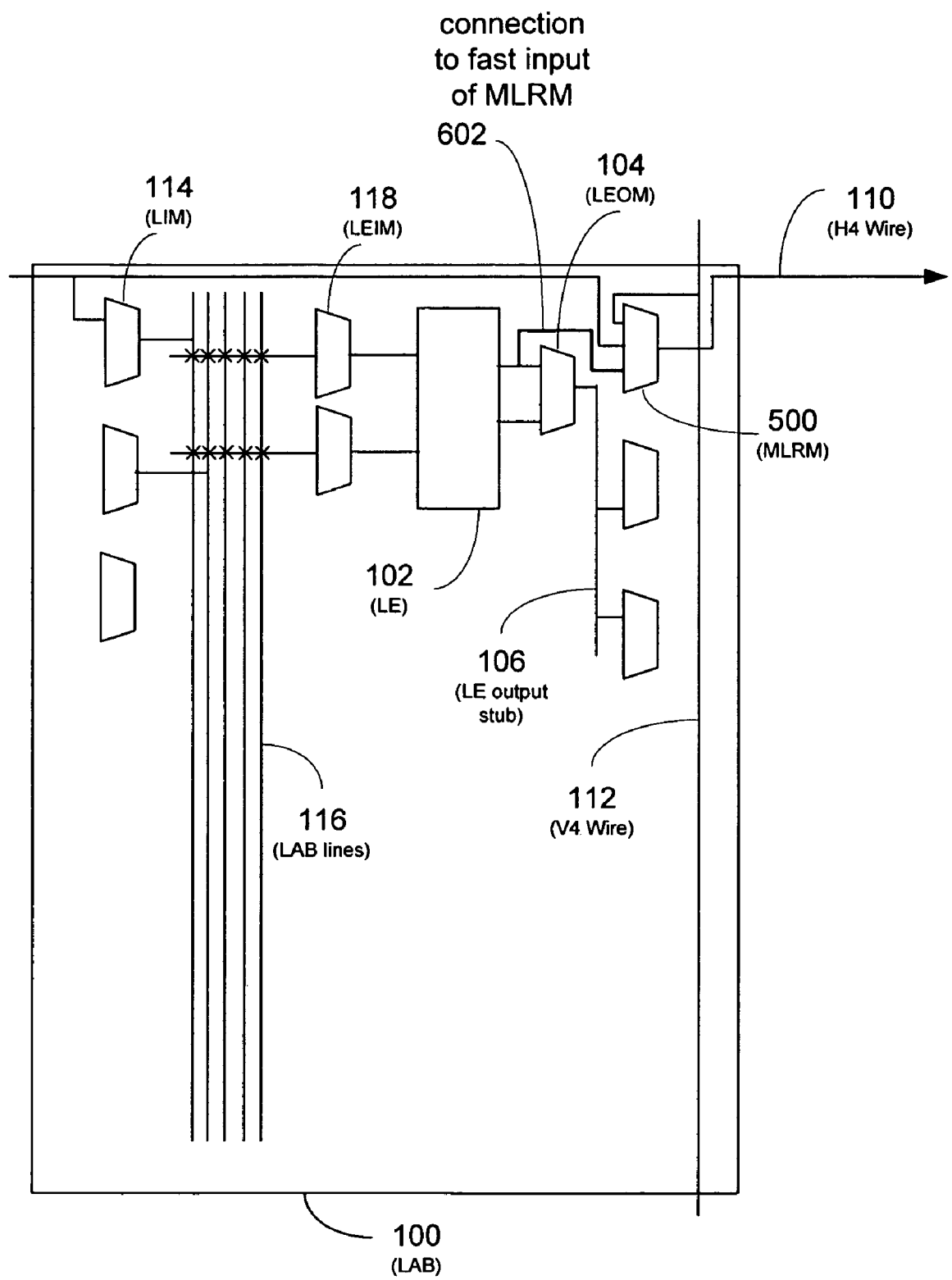
FIG. 6 illustrates a high-level view of connecting an LE output to a fast input of the MLRM according to an embodiment of the present invention.

FIG. 6 illustrates a high-level view of connecting an LE output to a fast input of the MLRM. The path 602 between the LE output and the fast input of the MLRM is highlighted.

Figure 7:
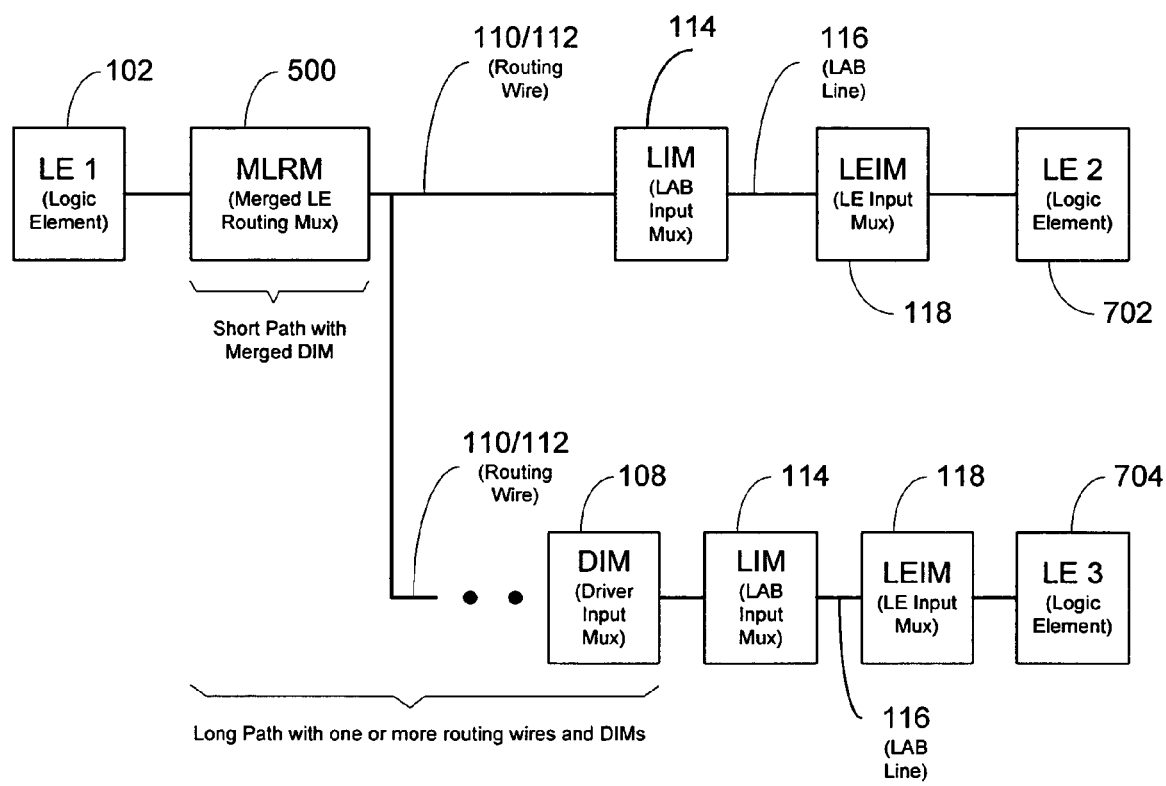
FIG. 7 illustrates a block diagram of signal paths according to an embodiment of the present invention.

FIG. 7 illustrates a block diagram of signal paths according to an embodiment of the present invention. The present invention distinguishes between a short connection path where there is only one routing wire segment (typically 4 LABs length) between two LEs and a long connection path where there is more than one routing wire segments between two LEs. As shown in FIG. 6, the short connection path between LE 1 (102) and LE 2 (702) includes an MLRM 500, a routing wire 110/112, an LIM 114, an LAB line 116, and an LEIM 118. The long connection path between LE 1 (102) and LE 3 (704) includes an MLRM 500, one or more routing wires 110/112 and DIMs 108, an LIM 114, an LAB line 116, and an LEIM 118. In the long connection path, the one or more DIMs 108 are used to connect the one or more routing wire segments 110/112.

Figure 8A:
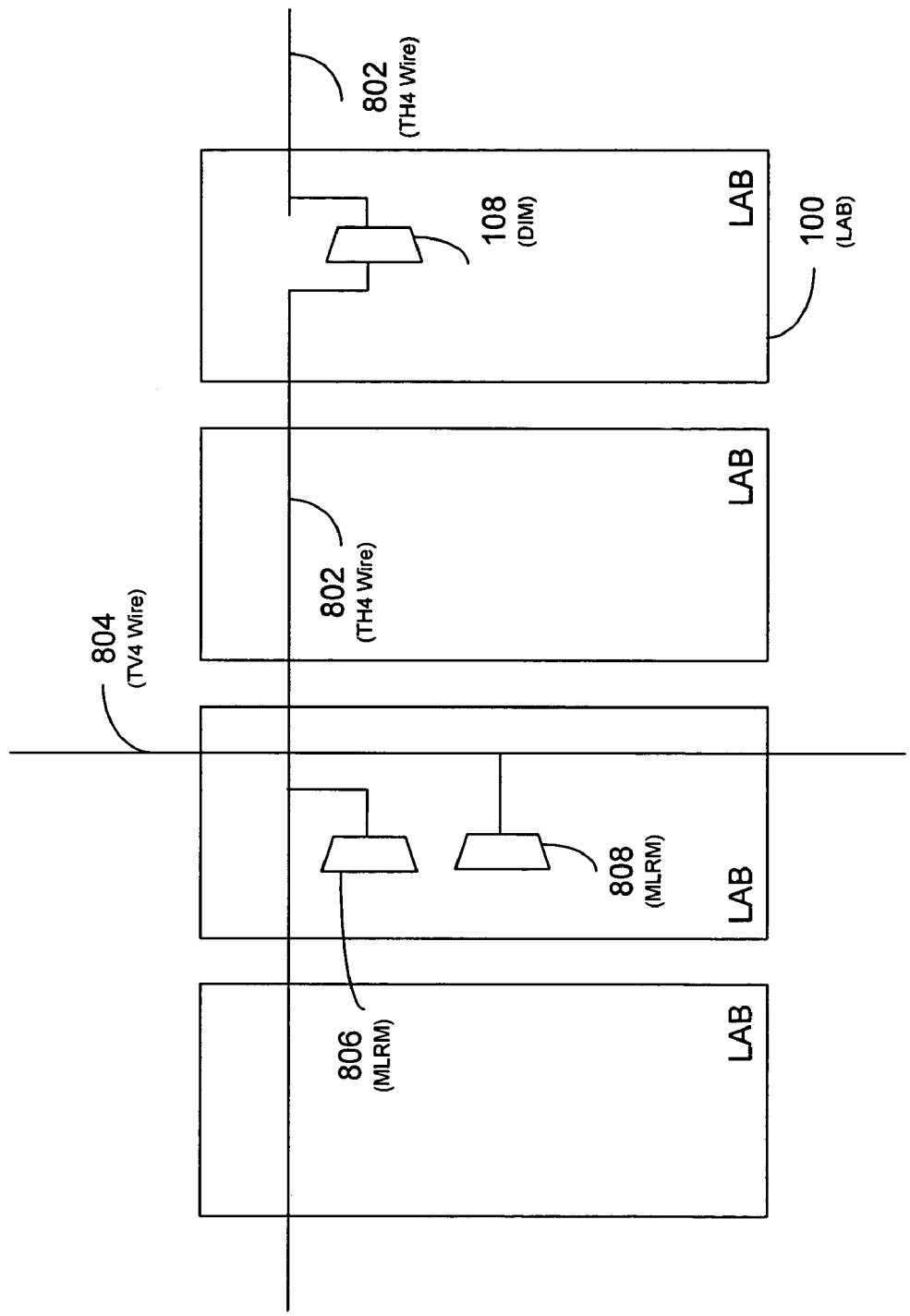
FIG. 8a illustrates a method of using horizontal and vertical routing wires for reducing the number of MLRMs in an LAB.

In order to take advantage of the improved performance of the MLRM, it is preferable that each LUT output connects to at least one MLRM driver input in each horizontal and vertical direction (described below in association with FIG. 8a and FIG. 8b). Inputs associated with LUT outputs use MLRM driver inputs, and other inputs use regular input multiplexers or fast input multiplexers. In this case, four MLRMs are required for each LUT output, corresponding to each of the up, down, left, and right routing directions.

However, within an LAB, there is a limited number of DIMs, which are used to form the MLRMs. Providing four MLRMs per LUT may make it necessary to use MLRMs for most or all of the routing wires in the LAB. For example, the Stratix II family of PLDs produced by Altera Corporation may contain 84 DIMs arranged as 52 H4 DIMs and 32 V4 DIMs, and the LAB has 16 LUT outputs. To provide one MLRM in each direction requires that each LUT output connect to 4 MLRMs, resulting in a total of 64 MLRMs, 16 MLRMs each for the H4 left-going, H4 right-going, V4 up, and V4 down directions. Thus a minimum of 64 of the total of 84 available DIMs are required to be MLRMs, while no more than 20 of the DIMs may be used for receiving inputs through the regular input multiplexers.

Note that an MLRM may be slower for DIM-to-DIM connections than a DIM, due to the extra delay introduced by the additional CMOS pass gate transistor inserted in series with the first stage DIM driver as well as the additional capacitance of the LE input. Thus, it may be desirable to avoid the need for four MLRMs per LE output and to provide a wider range of possible combinations of DIMs and MLRMs.

One approach is to have an MLRM connect to more than one LE output as shown in FIG. 4. This approach increases the loading at node 402 and thus reduces the speed because of the extra inputs to the MLRM. For example, if two LEs each have inputs to a MLRM in each direction, then a total of four MLRMs may be shared among two LEs. In other words, only two MLRMs per LE is required.

Yet another approach that avoids increasing the number of fast inputs to the MLRM is to use different types of routing wires that have a larger set of routing directions for the MLRMs. FIG. 8a illustrates a method of using horizontal and vertical routing wires for reducing the number of MLRMs in an LAB. As shown in FIG. 8a, a T-wire such as a TH4 802 or a TV4 804 is driven in the center. It can connect to other LABs 100 or DIMs 108 along its length, including stitching at the end. In this case each LE needs to drive one segment of TH4 wire or one segment of TV4 wire, reducing the number of MLRMs per LE from four to two, which are shown as 806 and 808.

Figure 8B:
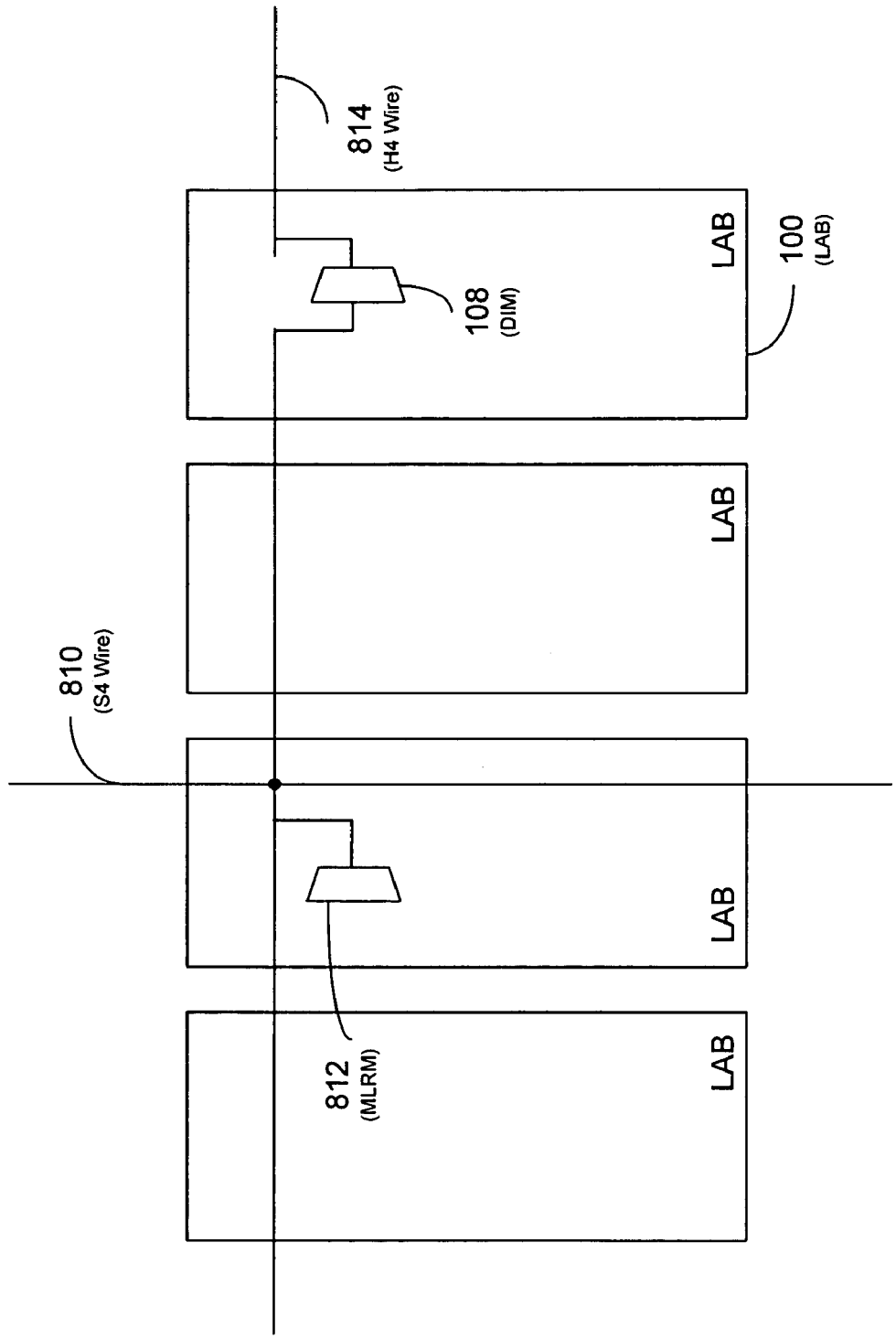
FIG. 8b illustrates a method of using star routing wires for reducing the number of MLRMs in an LAB.

In yet another approach, a star wire S4 810, illustrated in FIG. 8b, connects to both horizontal and vertical routing wires. In addition, the star wire S4 810 can be connected to other DIMs and LIMs along its path, and be stitched at the end of each routing wire segment to another routing wire such as an H4 wire 814. This approach reduces the number of MLRMs from four to one, which is shown as 812, as each MLRM can drive the routing wire in all four directions.

In other embodiments, the approaches described above may be combined, so that each MLRM may have multiple fast inputs from multiple LEs, use either T or S wires, or a combination of both. Further, the number of fast output connections may be increased beyond the one per direction by means of these approaches, instead of choosing the minimum number of MLRMs to satisfy this goal.

The present invention accomplishes faster routing between an LE output and its corresponding routing wire by merging the LE output and the DIM structure. This benefit can be illustrated by the following example. In typical PLD applications, a majority of the routing connections are relatively short. For purpose of illustration, assume that 60% of routing connections have a path that contains only one DIM and one routing wire segment, and that 40% of routing connections have more than one DIM and their corresponding routing wire segments. For simplicity, assume that the average length of connections longer than one DIM and one routing wire segment is 2.5 . That is, 60% of the connections use one DIM, and the remaining 40% of the connections use an average number of 2.5 DIMs. Thus the average connection has a length of 1.6 DIMs (60% connections*1.0 DIM+ 40% connections*2.5 DIMs). Of the 2.5 DIMs used by the longer connections, the first one is necessarily a connection between the LEOM and the first DIM, and the remaining 1.5 DIMs are connections between routing wires driven from one DIM to another DIM. In other words, the average routing connection has a first connection between the LEOM and the DIM plus an average of 0.6 DIM-to-DIM connection.

Since a majority of routing connections traverse only one routing wire segment (of 4 LABs long), the present invention has improved the overall performance of the PLD by making short connections fast, even at the cost of some speed degradation for longer distance connections. For example, by reducing the delay of the LE output multiplexer to DIM connection by 100 Pico seconds (ps), it may increase the delay of the DIM-to-DIM connections by 100 ps. This may still be preferable, since the average connection sees 100 ps benefit from the first connection, but only sees 60 ps (60%*100 ps) of slowdown on the remainder of the path. On average, this produces 40 ps of improvement per connection.

Figure 1:
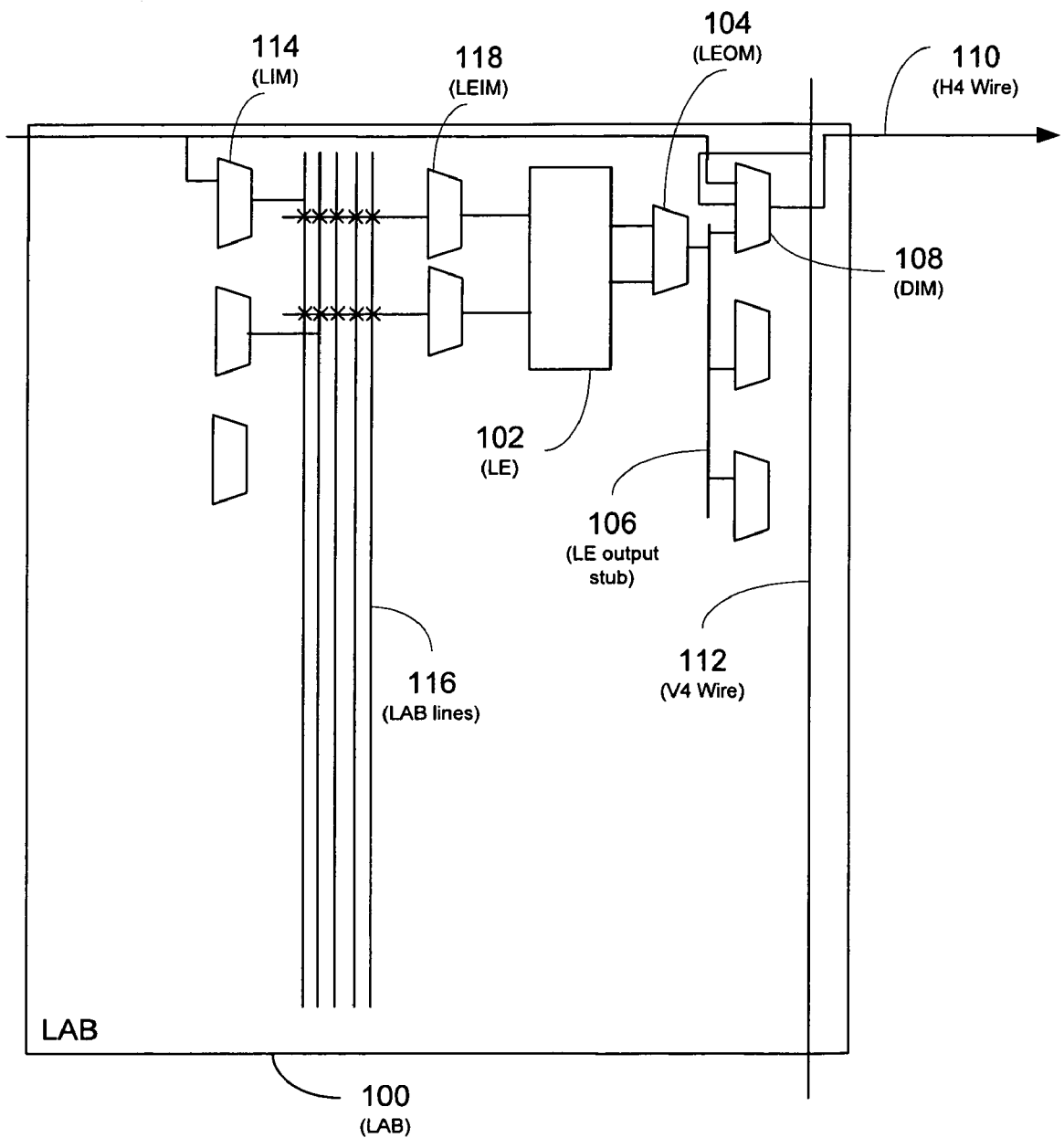
FIG. 1 illustrates a simplified representation of the architecture of a logic array block (LAB).
Figure 2:
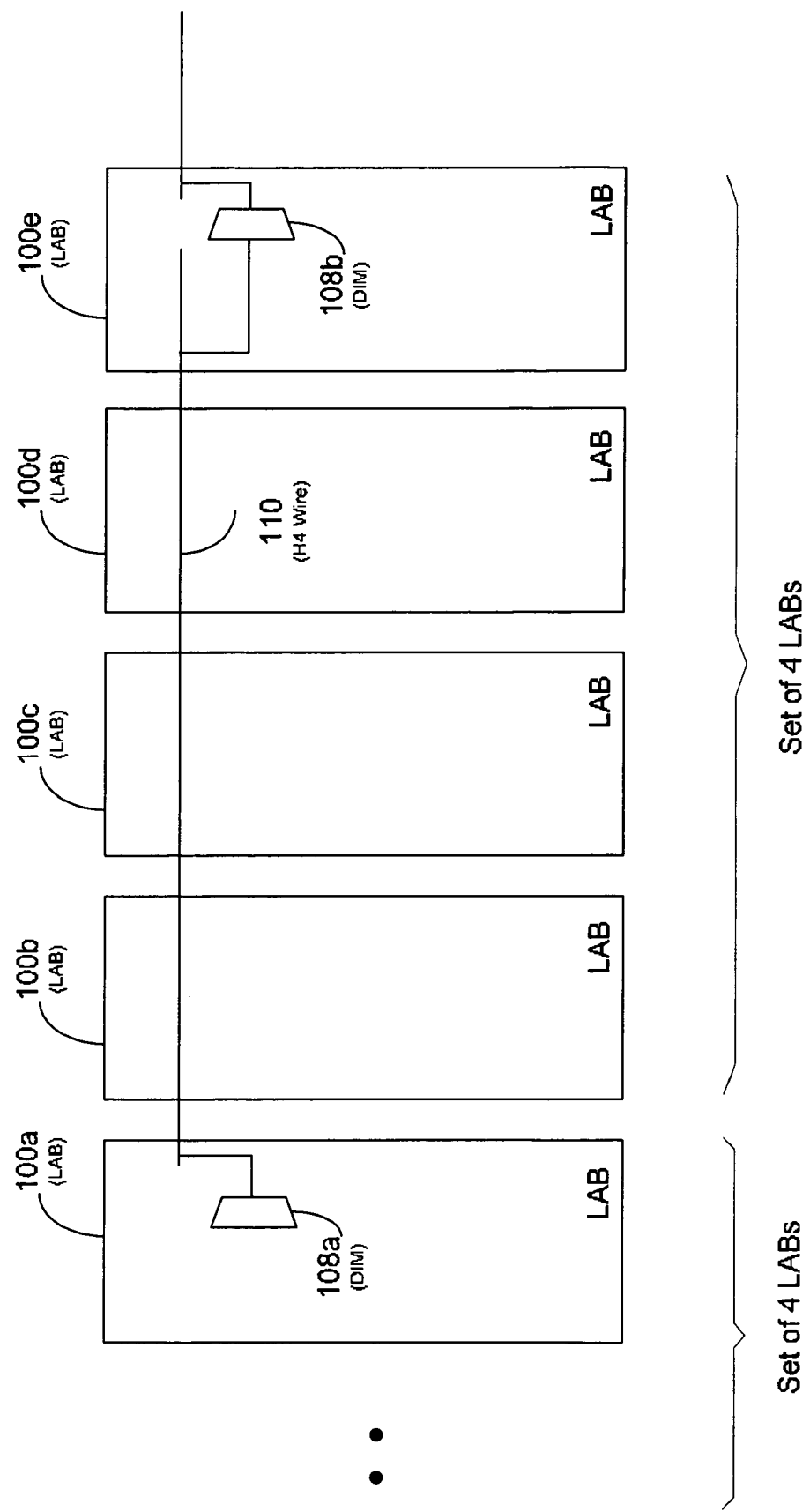
FIG. 2 illustrates a method of stitching segments of routing wires.
Figure 3:
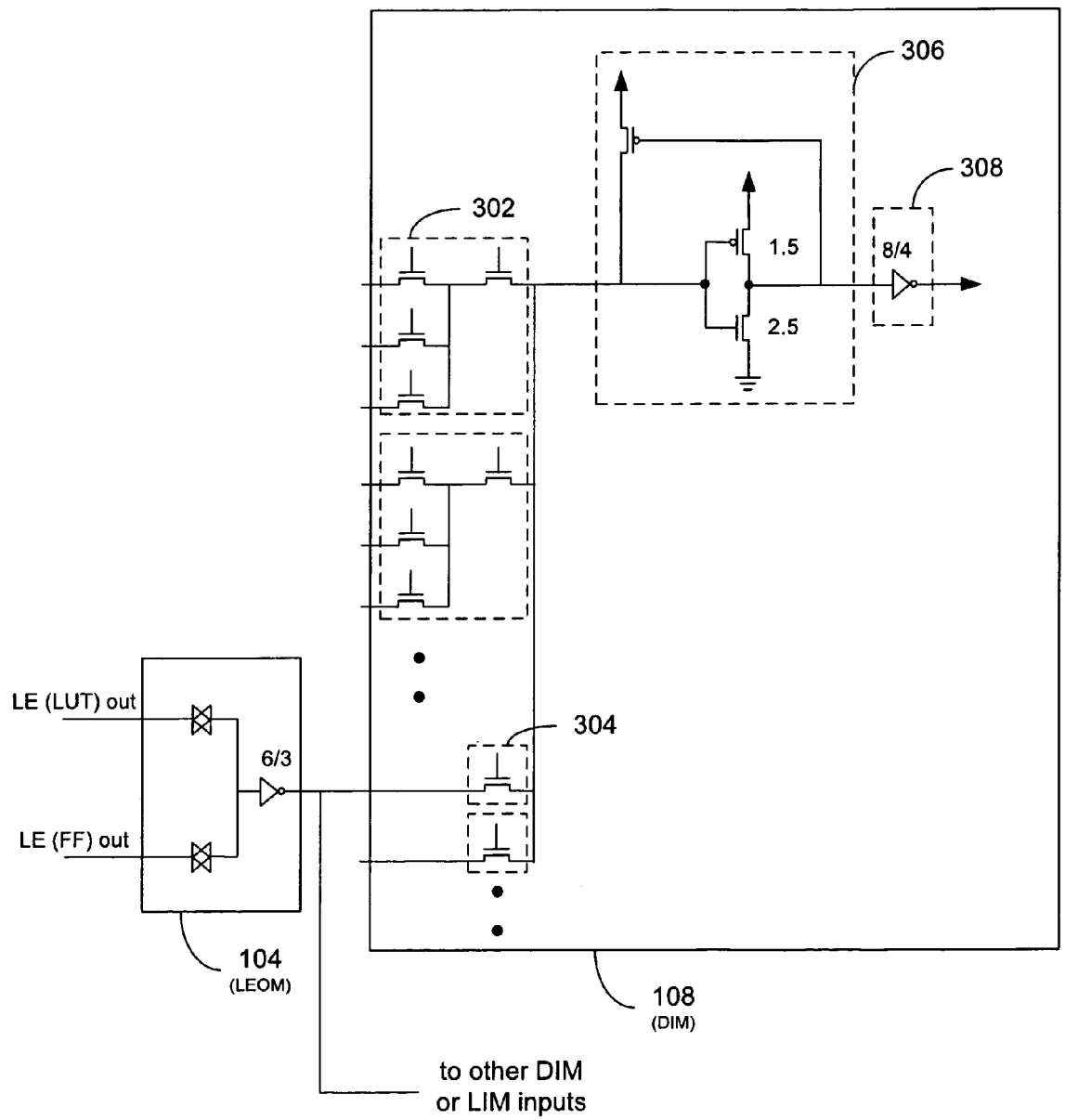
FIG. 3 illustrates a prior art implementation of a DIM in a programmable logic array.

The following example further illustrates the advantages of the invention. Assume in FIG. 1 that the LEOM 104 has a delay of 100 ps, the DIM 108 and the routing wire 110 have a delay of 250 ps, the LIM 114 and the LAB line 116 have a delay of 200 ps, and the LEIM 118 has a delay of 100 ps. In this case the shortest possible connection has a delay of 650 ps (100+250+200+100), and the average connection has an average delay of 800 ps (100+1.6*250+200+100 ps). Now referring to FIG. 5 and FIG. 6, suppose that the MLRM 500 has a delay from the LE to routing wire of 270 ps (increased from 250 due to the larger buffer it drives), and also increases the delay of the long path for having a DIM driving another DIM and routing wire to 280 ps (because of the extra CMOS pass gate inserted in series with the first-stage buffer in the DIM). Then the shortest possible delay between LE 1 and LE 2 becomes 570 ps (270+200+ 100). Since an average connection uses one LE output to routing wire connection and 0.6 DIM-to-DIM connection, it has an average delay of 738 ps (270+0.6*280+200+100), considerably less than the delay of 800 ps of FIG. 1. Therefore, the MLRM improves the performance of a PLD by substantially eliminating the delay of the first DIM in each routing path. Note that although the delay of the DIM has been removed, the delay associated with the routing wire is still present and the delays of the other components may have increased slightly, so the delay reduction may be less than the full 250 ps associated with the DIM and routing wire.

One skilled in the relevant art will recognize that many possible modifications and combinations of the disclosed embodiments may be used, while still employing the same basic underlying mechanisms and methodologies. The foregoing description, for purposes of explanation, has been written with references to specific embodiments. However, the illustrative discussions above are not intended to be exhaustive or to limit the invention to the precise forms disclosed. Many modifications and variations are possible in view of the above teachings. The embodiments were chosen and described to explain the principles of the invention and their practical applications, and to enable others skilled in the art to best utilize the invention and various embodiments with various modifications as are suited to the particular use contemplated.

What is claimed is:

1. A merged logic element routing multiplexer (MLRM) for driving a signal between a logic element (LE) output and an inter logic block array (LAB) routing wire in a programmable logic device, comprising:
   one or more inputs coupled to the LE output;
   one or more tri-stated circuits coupled to the corresponding one or more inputs, wherein the tri-stated circuits are controlled by a set of programmable select signals; and an output port coupled to the inter-LAB routing wire, wherein the output port is connected to output ports of the tri-stated circuits through a buffer circuit.

2. The merged logic element routing multiplexer of claim 1, wherein the routing wire is coupled to a first LAB input multiplexer (LIM).

3. The merged logic element routing multiplexer of claim 2, wherein the first LAB input multiplexer (LIM) is coupled to a first LB input multiplexer (LEIM) and a second LB in series.

4. The merged logic element routing multiplexer of claim 1, wherein the inter-LAB routing wire is coupled to one or more driver input multiplexers (DIMs).

5. The merged logic element routing multiplexer of claim 4, wherein the one or more driver input multiplexers is coupled to a second LIM, a second LEIM and a third LE in series.

6. The merged logic element routing multiplexer of claim 1, wherein the tri-stated circuit comprises:
  a first positive metal-oxide semiconductor (PMOS) transistor having a source terminal coupled to a power supply, a gate terminal coupled to a select signal;
  a second PMOS transistor having a source terminal coupled to a drain terminal of the first PMOS transistor, a gate terminal coupled to an input signal, and a drain terminal coupled to an output port of the tri-stated circuit;
  a first negative metal-oxide semiconductor (NMOS) transistor having a drain terminal coupled to the output port of the tri-stated circuit, a gate terminal coupled to the input signal; and
  a second NMOS transistor having a drain terminal coupled to a source terminal of the first NMOS transistor, a gate terminal coupled to an inverted select signal, and a source terminal coupled to a circuit ground.

7. The merged logic element routing multiplexer of claim 1, wherein the tri-stated circuit is a CMOS pass gate transistor.

8. The merged logic element routing multiplexer of claim 1 further comprising:
  one or more regular DIM paths coupled between the LE output and the inter-LAB routing wire; and
  one or more fast DIM paths coupled between the LE output and the inter-LAB routing wire.

9. The merged logic element routing multiplexer of claim 8, wherein a regular DIM path comprises:
  a first plurality of NMOS pass transistors with a common output terminal;
  a second NMOS pass transistor coupled to the common output terminal of the first plurality of NMOS pass transistors; and
  a tri-stated level restoring circuit coupled to the second NMOS pass transistor; and a buffer circuit coupled to the output of the tri-stated level restoring circuit.

10. The merged logic element routing multiplexer of claim 9, wherein the tri-stated level restoring circuit comprises:
  a first PMOS transistor having a source terminal coupled to a power supply, a gate terminal coupled to an inverted select signal;
  a second PMOS transistor having a source terminal coupled to a drain terminal of the first PMOS transistor, a gate terminal coupled to an input signal, and a drain terminal coupled to an output port of the tri-stated level restoring circuit;
  a third PMOS transistor having a source terminal coupled to the power supply, a gate terminal coupled to the output port of the tri-stated level restoring circuit, and a drain terminal coupled to the input signal;
  a first NMOS transistor having a drain terminal coupled to the output port of the tri-stated level restoring circuit, a gate terminal coupled to the input signal; and
  a second NMOS transistor having a drain terminal coupled to a source terminal of the first NMOS transistor, a gate terminal coupled to a select signal, and a source terminal coupled to a circuit ground.

11. The merged logic element routing multiplexer of claim 9, wherein the tri-stated level restoring circuit comprises:
  a first PMOS transistor having a source terminal coupled to a power supply, a gate terminal coupled to an input signal, and a drain terminal coupled to the output of the tri-stated level restoring circuit through a pass gate circuit;
  a second PMOS transistor having a source terminal coupled to the power supply, a gate terminal coupled to the drain terminal of the first PMOS transistor, and a drain terminal coupled to the input signal; and
  a first NMOS transistor having a drain terminal coupled to the drain terminal of the first PMOS transistor, a gate terminal coupled to the input signal, and a source terminal coupled to a circuit ground.

12. The merged logic element routing multiplexer of claim 8, wherein a fast DIM path comprises:
  one or more NMOS pass transistors with a common output terminal; end
  a tri-stated level restoring circuit coupled to the common output terminal of the one or more NMOS pass transistors; and
  a buffer circuit coupled to the output of the tri-stated level restoring circuit.

13. A programmable logic device, comprising:
  a first logic element (LE) of a sender logic array block (LAB);
  an inter-LAB routing wire connected to one or more receivers; and
  a merged logic element routing multiplexer (MLRM) for receiving outputs from the first LE of the sender LAB and driving the inter-LAB routing wire connected to the one or more receivers, wherein the MLRM comprises:
  one or more MLRM driver inputs coupled to the corresponding LE outputs; one or more tri-stated circuits coupled to the corresponding one or more MLRM driver inputs, wherein the tri-stated circuits are controlled by a set of programmable select signals; and
  an output port coupled to the inter-LAB routing wire, wherein the output port is connected to output ports of the tri-stated circuits through a buffer circuit.

14. The programmable logic device of claim 13, wherein the routing wire is coupled to a first LAB input multiplexer (LIM).

15. The programmable logic device of claim 13, wherein the inter-LAB routing wire is coupled to one or more driver input multiplexers (DIMs).

16. The programmable logic device of claim 13, wherein the tri-stated circuit comprises:
  a first PMOS transistor having a source terminal coupled to a power supply, a gate terminal coupled to a select signal;
  a second PMOS transistor having a source terminal coupled to a drain terminal of the first PMOS transistor, a gate terminal coupled to an input signal, and a drain terminal coupled to an output port of the tri-stated circuit;

a first NMOS transistor having a drain terminal coupled to the output port of the tri-stated circuit, a gate terminal coupled to the input signal; and a second NMOS transistor having a drain terminal coupled to a source terminal of the first NMOS transistor, a gate terminal coupled to an inverted select signal, and a source terminal coupled to a circuit ground.

17. The programmable logic device of claim 13, wherein the tri-stated circuit is a CMOS pass gate transistor.

18. The programmable logic device of claim 13 further comprising:

one or more regular DIM paths coupled between the LE output and the inter-LAB routing wire; and one or more fast DIM paths coupled between the LE output and the inter-LAB routing wire.

19. The programmable logic device of claim 18, wherein a regular DIM path comprises:

a first plurality of NMOS pass transistors with a common output terminal;

a second NMOS pass transistor coupled to the common output terminal of the first plurality of NMOS pass transistors;

a tri-stated level restoring circuit coupled to the second NMOS pass transistor; and a buffer circuit coupled to the output of the tri-stated level restoring circuit.

20. The programmable logic device of claim 19, wherein the tri-stated level restoring circuit comprises:

a first PMOS transistor having a source terminal coupled to a power supply, a gate terminal coupled to an inverted select signal;

a second PMOS transistor having a source terminal coupled to a drain terminal of the first PMOS transistor, a gate terminal coupled to an input signal, and a drain terminal coupled to an output port of the tri-stated level restoring circuit;

a third PMOS transistor having a source terminal coupled to the power supply, a gate terminal coupled to the output port of the tri-stated level restoring circuit, and a drain terminal coupled to the input signal;

a first NMOS transistor having a drain terminal coupled to the output port of the tri-stated level restoring circuit, a gate terminal coupled to the input signal; and a second NMOS transistor having a drain terminal coupled to a source terminal of the first NMOS transistor, a gate terminal coupled to a select signal, and a source terminal coupled to a circuit ground.

21. The programmable logic device of claim 19, wherein the tri-stated level restoring circuit comprises:

a first PMOS transistor having a source terminal coupled to a power supply, a gate terminal coupled to an input signal, and a drain terminal coupled to the output of the tri-stated level restoring circuit through a pass gate circuit;

a second PMOS transistor having a source terminal coupled to the power supply, a gate terminal coupled to the drain terminal of the first PMOS transistor, and a drain terminal coupled to the input signal; and a first NMOS transistor having a drain terminal coupled to the drain terminal of the first PMOS transistor, a gate terminal coupled to the input signal, and a source terminal coupled to a circuit ground.

22. The programmable logic device of claim 18, wherein a fast DIM path comprises:

one or more NMOS pass transistors with a common output terminal;

a tri-stated level restoring circuit coupled to the common output terminal of the one or more NMOS pass transistors; and a buffer circuit coupled to the output of the tri-stated level restoring circuit.

23. The programmable logic device of claim 13, wherein the inter-LAB routing wire routes signals to the plurality of LABs on both directions of the MLRM horizontally.

24. The programmable logic device of claim 13, wherein the inter-LAB routing wire routes signals to the plurality of LABs on both directions of the MLRM vertically.

25. The programmable logic device of claim 13, wherein the inter-LAB routing wire is a star wire for routing signals to the plurality of LABs on four directions of the MLRM both horizontally and vertically.

26. The programmable logic device of claim 13, wherein the one or more receivers comprise at least an item selected from the group consisting of a logic array block (LAB), a driver input multiplexer (DIM), and a LAB input multiplexer (LIM).

27. A programmable logic device, comprising:

a first logic element (LE) of a sender logic array block (LAB);

an inter-LAB routing wire connected to one or more receivers; and a merged logic element routing multiplexer (MLRM) for receiving outputs from the first LE of the sender LAB and driving the inter-LAB routing wire connected to the one or more receivers, wherein the inter-LAB routing wire is a star wire for routing signals to the plurality of LABs on four directions of the MLRM both horizontally and vertically, wherein the MLRM comprises:

one or more MLRM driver inputs coupled to the corresponding LE outputs;

one or more tri-stated circuits coupled to the corresponding one or more MLRM driver inputs, wherein the tri-stated circuits are controlled by a set of programmable select signals; and an output Port coupled to the inter-LAB routing wire, wherein the output port is connected to output ports of the tri-stated circuits through a buffer circuit.

* * * * *